US008488811B2

(12) United States Patent  
Smithers et al.

(10) Patent No.: US 8,488,811 B2
(45) Date of Patent: Jul. 16, 2013

(54) AUDIO-PEAK LIMITING IN SLOW AND FAST STAGES

(75) Inventors: Michael John Smithers, Kareela (AU); Brett Graham Crockett, Brisbane, CA (US); David Stanley McGrath, Sydney (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 990 days.

(21) Appl. No.: 12/310,049

(22) PCT Filed: Aug. 8, 2007

(86) PCT No.: PCT/US2007/017588
§ 371 (c)(1),
(2), (4) Date: Jun. 22, 2009

(87) PCT Pub. No.: WO2008/021110
PCT Pub. Date: Feb. 21, 2008

(65) Prior Publication Data
US 2009/0271185 A1    Oct. 29, 2009

Related U.S. Application Data

(60) Provisional application No. 60/836,748, filed on Aug. 9, 2006.

(51) Int. Cl.
*H03G 3/00* (2006.01)
*H03G 3/20* (2006.01)

(52) U.S. Cl.
USPC .............................................. 381/107; 381/57

(58) Field of Classification Search
USPC .......... 381/66, 83, 93, 96, 71.9, 71.11, 71.12, 381/74.1, 74.3, 74.7, 57, 107, 56, 104
See application file for complete search history.

(56) References Cited

U.S. PATENT DOCUMENTS

| 4,455,676 | A | 6/1984 | Kaneda |
| 6,556,685 | B1 * | 4/2003 | Urry et al. .................... 381/94.1 |

(Continued)

FOREIGN PATENT DOCUMENTS

| JP | H8-22452 | 1/1996 |
| JP | H10-303666 | 11/1998 |

(Continued)

OTHER PUBLICATIONS

Shorter, D.E.L., et al., "The Dynamic Characteristics of Limiters for Sound Programme Circuits" BBC Search Report, EL-5, 1967/13, Apr. 1967.

(Continued)

*Primary Examiner* — Fan Tsang
*Assistant Examiner* — Eugene Zhao

(57) ABSTRACT

A method and apparatus for limiting the absolute magnitude of an audio signal. The method may include firstly variable-gain reducing the gain of an audio signal, and then secondly variable-gain reducing the gain of the audio signal faster than the first variable-gain reduction, thereby limiting the absolute magnitude of the audio signal to a threshold. The first variable-gain reduction may include variable-gain reducing the gain of the audio signal in a first stage, and the second variable-gain reduction may include variable-gain reducing the gain of the audio signal in a second stage that reduces the gain faster than the first stage. The second variable-gain reduction may include delaying the audio signal, finding a peak among the delayed audio signal, calculating a fast gain from a found peak, and modifying the delayed audio signal with the calculated fast gain.

18 Claims, 10 Drawing Sheets

U.S. PATENT DOCUMENTS

| | | | |
|---|---|---|---|
| 2002/0057808 A1* | 5/2002 | Goldstein | 381/106 |
| 2006/0018493 A1 | 1/2006 | Oh et al. | |
| 2006/0148435 A1 | 7/2006 | Romesburg | |
| 2008/0056504 A1* | 3/2008 | Gorges et al. | 381/55 |

FOREIGN PATENT DOCUMENTS

| | | |
|---|---|---|
| JP | 2001320793 | 11/2001 |
| JP | 2003-068013 | 7/2003 |

OTHER PUBLICATIONS

"Level Magic Introduction & Reference Guide," Juenger Audio, Berlin, 2005, http://junger-audio.com/website/pdf/051202_LM_intro.pdf.

"Level Magic Introduction & Reference Guide," Juenger Audio, Berlin, 2005, http://www.tripleaudio.nl/webshop/presspdf/levelmagic.pdf.

* cited by examiner

Input PCM audio, sinusoidal tone, 0.707 (-3 dB) peak amplitude

*a)*

*b)*

AUDIO-PEAK LIMITING IN SLOW AND FAST STAGES

TECHNICAL FIELD

This invention generally relates to audio digital signal processing and audio peak limiting. More particularly, the invention relates to variable-gain reduction of an audio signal to limit the audio signal to a threshold.

BACKGROUND ART

Audio peak limiting has been a fundamental part of the production, transmission and reproduction of audio for over 50 years. As FIG. 1 shows, in its most basic form an audio peak limiter provides an input to output signal level characteristic such that the output voltage is equal to the input voltage up to the peak-limiting threshold. For input audio signals with amplitude above the threshold, the output audio-signal level is constrained (limited) so as not to exceed the threshold. As with other dynamic gain control systems for audio, the method of modifying the gain has a significant impact on the nature and audibility of artifacts introduced into the output audio signal.

In one of its earliest uses, audio peak limiting controlled audio-signal amplitudes to prevent over-modulation during radio broadcasts. Today, audio peak limiting still routinely prevents over-modulation in radio and television broadcasts.

Audio peak limiting has also been an important part of phonograph-record mastering. Phonograph mastering involves a lathe cutting grooves into a phonograph-record master disc that represent the audio waveform. In this case, limiting constrains the amplitude of the audio and, therefore, the width and depth of grooves of the phonograph record so that they fit within the physical limitations of the phonograph medium.

With the advent of digital audio technology, control of the audio amplitude using peak limiting continues to be important during both recording and reproduction. During digital audio recording, which converts analog to digital, if the input analog audio signal exceeds the input signal level corresponding to the maximum digital audio sample that can be represented by the digital system (0 dBFS), the resulting recorded digital representation of the audio will be clipped. This occurs because analog audio signal levels above 0 dBFS can be at most represented by 0 dBFS. Similarly, if multiple digital audio signals are mixed in the digital domain without scaling, during playback it is possible for the sum of the audio data to exceed 0 dBFS, the maximum digital signal that can be represented during the digital-to-analog conversion. The result is a clipped output analog waveform.

A typical example of clipping, representative of both digital recording and reproduction is shown in FIG. 2. Mixing of multiple digital audio signals has become very common with the advent of modern multi-channel audio formats (such as Dolby Digital 5.1 and MLP) and reproduction systems that downmix multi-channel material for playback on stereo- or mono-compatible systems.

Recently, in mastering digital audio material (i.e., CD and DVD audio), peak limiting algorithms are standard in order to allow the level (and therefore apparent loudness) of the audio to increase without exceeding a user-defined peak level (for example −0.1 dBFS or 0 dBFS). This practice has become increasingly prevalent as the desire to produce louder and louder representations of audio has grown.

Audio peak limiting can be performed either on the complete, full-bandwidth signal or in a multi-band approach which performs individual peak limiting operations on different and distinct audio frequency bands. For multi-band peak limiting, the individually processed frequency bands are summed following peak limiting to re-create a composite signal.

In general, wide-band peak limiting is used when a minimal alteration of the audio spectrum and timbre is preferred, such as with music mastering. Multi-band limiting is often used to achieve significant amounts of peak limiting, but with the potential of significantly altering the spectral characteristics and perceived timbre of the audio. Uses of multi-band limiting include FM radio transmission where a station wishes to have a very loud perceived sound level as well as have a unique "sound"—dictated by the settings of the multi-band limiter.

Peak limiting in music mastering typically requires gain reductions between 0 and approximately 20 dB. Downmixing five (5) channel surround audio signals to two (2) channel stereo signals, as occurs in DVD players and home-theater receivers, requires up to 9 dB of gain reduction—where, for example, the stereo left channel is a sum of the left, left surround and −3 dB reduced center channel for the 5-channel surround signal.

Fairly inaudible peak limiting can typically be achieved for gain reductions in the range of 0 to 12 dB, and some commercial products exist that perform well in this range. Limiting requiring gain reductions larger than approximately 12 dB can become quite audible, and in this discussion gain reduction larger than approximately 12 dB is considered large or significant.

BRIEF SUMMARY OF THE INVENTION

Herein are taught methods and apparatus for limiting the absolute magnitude of an audio signal. The method may include firstly variable-gain reducing the gain of an audio signal, and then secondly variable-gain reducing the gain of the audio signal faster than the first variable-gain reduction, thereby limiting the absolute magnitude of the audio signal to a threshold. The first variable-gain reduction may include variable-gain reducing the gain of the audio signal in a first stage, and the second variable-gain reduction may include variable-gain reducing the gain of the audio signal in a second stage that reduces the gain faster than the first stage.

The first variable-gain reduction may include detecting an excursion in the audio signal beyond the threshold, calculating a slow gain using the detected excursion, and applying the slow gain to the audio signal.

The second variable-gain reduction may include delaying the audio signal, finding a peak among the delayed audio signal, calculating a fast gain from a found peak, and modifying the delayed audio signal with the calculated fast gain. The delaying may include buffering the audio signal, and the finding may include examining the buffered audio signal. Apparent directions of respective virtual images and directions of respective matrix-encoded audio signals may be maintained. The second variable-gain reduction may produce less audible spectral splatter than a method as constituted above except lacking the delaying. The buffering may include providing a finite amount of time for the second variable-gain reduction to slew to meet a peak beyond the threshold. The delaying may include delaying for at least 1 ms and may include delaying for about 1.5 ms. Finding the peak may include determining maximums in respective temporal segments of the delayed audio signal, delaying the audio-signal maximums, and computing a control signal for reducing the gain of the audio signal, based on the delayed maximums.

The delaying first above may match the delaying recited further above. The computing may include computing the control signal as a function of the low-pass filtering of the delayed maximums. The computing may include computing the control signal as a function of the weighted averaged delayed maximums.

The computing may include using coefficients of the filtering that are a function of the square root of a Hanning Window. The use may include sizing the Hanning Window the same length as the delay buffer.

The computing may include using weighting values that are a function of the square root of a Hanning Window. The use may include sizing the Hanning Window the same length as the delay buffer.

Calculation of the fast gain may include substantially reversing the determining, delaying and computing of the finding of the peak. The calculation of a fast gain may include calculating the fast gain as the inverse of the sum of 1 and the computed control signal for reducing the gain.

The calculation of a fast gain may include calculating the fast gain by Newton-Rhapson approximation. The calculating may include calculating by Newton-Rhapson approximation whose convergence is slowed. The calculating may include calculating by slowed Newton-Rhapson approximation where speed of convergence S is limited such that:

$$-\frac{1}{2} < S*((x_0*a)-1) < \frac{1}{2}.$$

The calculating may include calculating by slowed Newton-Rhapson approximation where speed of convergence S is about 0.3.

Herein is also taught a computer-readable medium containing a computer program for executing one of the above methods.

Herein is also taught a computer system including a CPU, one of the computer-readable media and a bus coupling the CPU and the medium.

Herein is also taught an audio peak limiter. The peak limiter may include a first variable-gain reducer for variable-gain reducing the gain of an audio signal, and a second variable-gain reducer for further variable-gain reducing the gain of the audio signal faster than the first variable-gain reduction, thereby limiting the absolute magnitude of the audio signal to a threshold. The first variable-gain reducer may include a first stage for variable-gain reducing the gain of the audio signal, and the second variable-gain reducer may include a second stage for variable-gain reducing the gain of the audio signal in a second stage that reduces the gain faster than the first stage.

The first variable-gain reducer may include a delay for delaying an audio signal, a peak finder for finding a peak within the delayed audio signal, a fast-gain calculator for calculating a fast gain reduction using a found peak, and a modifier for modifying the delayed audio signal with the calculated fast gain.

The delay may include a buffer, and the peak finder may include an examiner of the buffered audio signal. Apparent directions of respective virtual images and directions of respective matrix-encoded audio signals may be maintained. The second variable-gain reduction may produce less audible spectral splatter than a peak limiter as above except lacking the delay. The delay may include a delay of at least 1 ms and may include a delay of about 1.5 ms. The peak finder may include a difference engine for determining maximums in respective temporal segments of the delayed audio signal, a delay buffer for delaying the audio-signal maximums, and a computer for computing a control signal for reducing the gain of the audio signal, based on the delayed maximums.

The delay buffer of the peak finder may match the delay of the peak limiter. The computer may include a computer for computing the control signal as a function of the low-pass filtering of the delayed maximums. The computer may include a computer for computing the control signal as a function of the weighted averaged delayed maximums.

The coefficients of the filtering may be a function of the square root of a Hanning Window. The Hanning Window may be the same length as the delay buffer.

The weighting values may be a function of the square root of a Hanning Window. The Hanning Window may be the same length as the delay buffer.

The fast-gain calculator may include a fast-gain calculator for calculating a fast gain reduction by substantially reversing the operation of the peak finder. The fast-gain calculator may include a fast-gain calculator for calculating the fast gain as the inverse of the sum of 1 and the computed control signal for reducing the gain.

The fast-gain calculator may include a fast-gain calculator for calculating the fast gain The fast-gain calculator may include a fast-gain calculator for calculating by Newton-Rhapson approximation whose convergence is slowed. The fast-gain calculator may include a fast-gain calculator for calculating by slowed Newton-Rhapson approximation where speed of convergence S is limited such that:

$$-\frac{1}{2} < S*((x_0*a)-1) < \frac{1}{2}$$

The fast-gain calculator may include a fast-gain calculator for calculating by slowed Newton-Rhapson approximation where speed of convergence S is about 0.3.

The various features of the present invention and its preferred embodiments may be better understood by referring to the following discussion and the accompanying drawings.

DETAILED DESCRIPTION OF THE INVENTION

Figure 1:
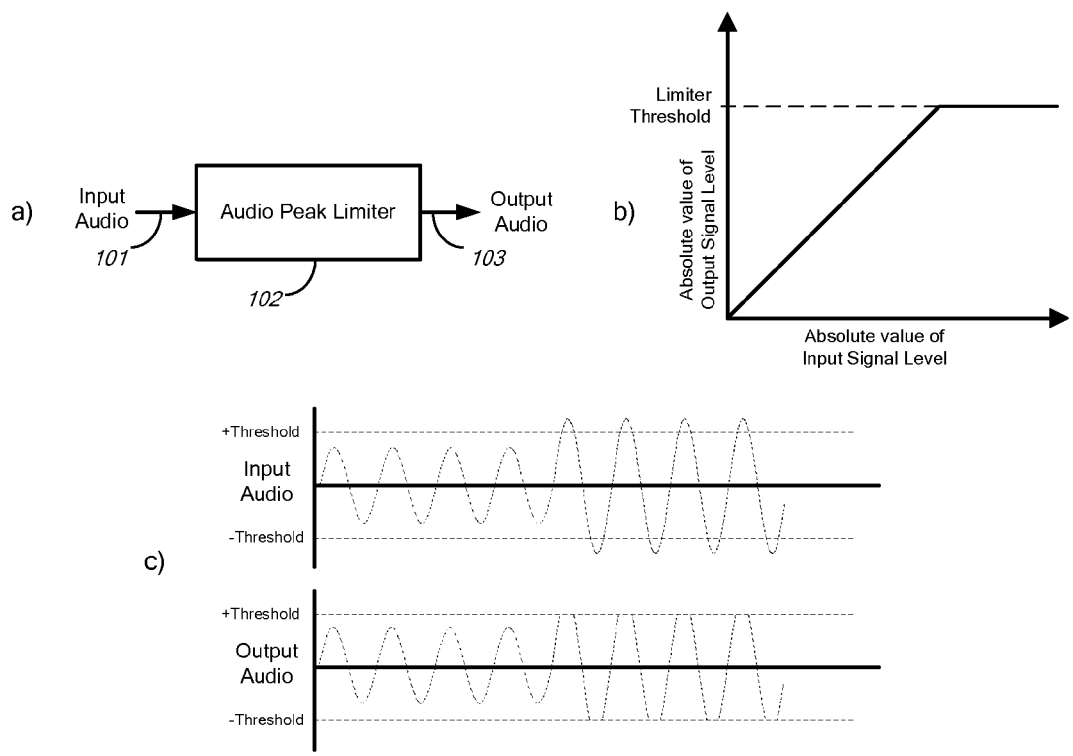
FIG. 1 summarizes the operation of a typical audio limiter, diagramming an audio limiter at the system-block level, showing the typical input/output voltage characteristic of an audio limiter with an arbitrary threshold and providing an example of an audio signal before and after peak limiting processing.
Figure 2:
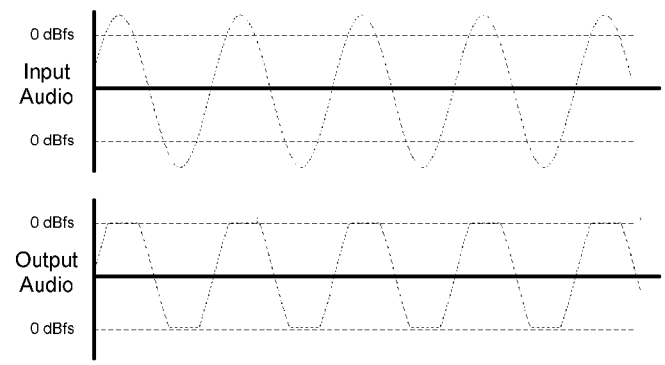
FIG. 2 shows a typical example of clipping, representative of both digital recording and reproduction.
Figure 3A:
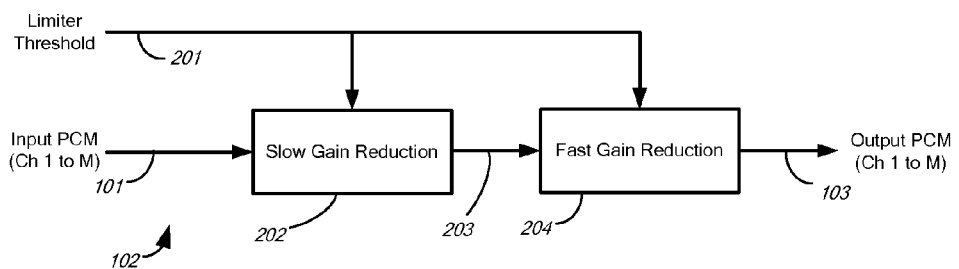
FIG. 3a illustrates a two-stage audio peak limiter according to one embodiment of the invention.

FIG. 3a illustrates a two-stage audio peak limiter 102 according to one embodiment of the invention. The peak limiter 102 includes a slow gain reducer 202 and a fast gain reducer 204. The slow gain reducer 202 receives as input a threshold signal 201 and an audio signal 101 and produces as intermediate audio signal 203. The fast gain reducer 204 receives as input the intermediate audio signal 203 as well as the threshold signal 201 and produces as output the audio signal 103.

The peak limiter 102 operates as follows: The slow gain reducer 202 receives one or more audio channels by means of the input signal 101 and a signal representing the limiter threshold by means of the threshold signal 201. The absolute peak(s) of the audio channel(s) may exceed the limiter threshold.

The fast gain reducer 204 outputs signal 103, the possibly limited audio channel(s) of the input audio signal 101. The limiter 102 limits (gain reduces) any absolute peaks in the input audio signal 101 exceeding the limiter threshold to no more than the limit threshold.

Figure 3B:
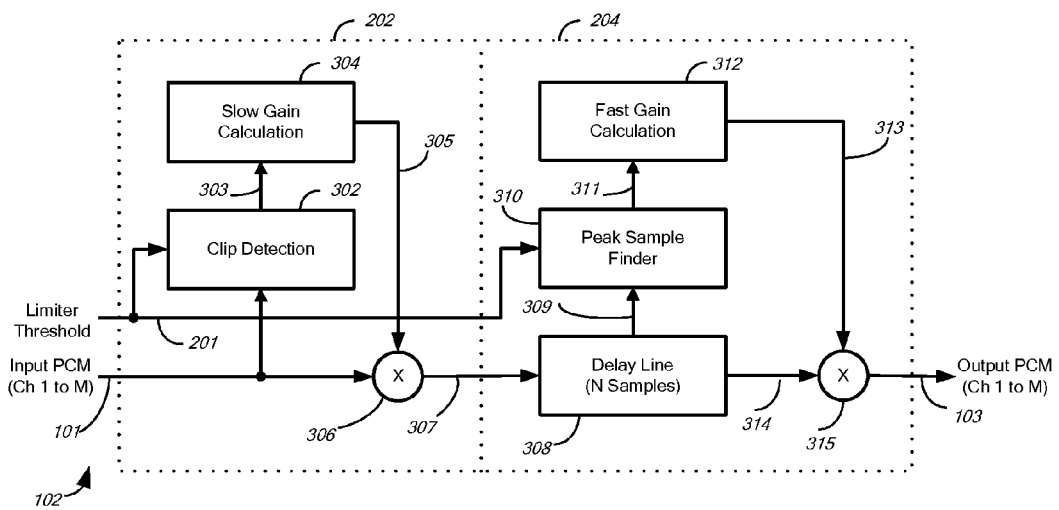
FIG. 3b further details the audio peak limiter of FIG. 3a, according to one embodiment of the invention.

The input and output audio signals 101 and 103, respectively, may be linear PCM samples according to one embodiment of the invention. The threshold signal 201 may be a value in units of dBFS. Then, x denotes the input audio signal 101, M represents the number of input channels in the input audio signal 101, and in the notation x[m,n], m is the channel index from 0 through M−1 and n the sample index FIG. 3b further details the peak limiter 102 according to one embodiment of the invention. Slow gain reducer 202 includes an excursion/excess detector 302, a slow gain calculator 304 and a multiplier 306. The excursion detector 302 receives as input the threshold signal 201 and the audio signal 101 and produces as output control signal Q[n] 303. The slow gain calculator 304 receives as input the control signal Q[n] 303 and produces as output the current slow gain value $G_{SLOW}$[n] signal 305. The multiplier 306 receives as input the input audio signal 101 and the current slow gain value $G_{SLOW}$[n] signal 305 and produces as output the gain-reduced audio signal x'[m,n] 307.

The fast gain reducer 204 includes a fast gain calculator 312, a peak-sample finder 311, a delay 308 and a multiplier 315. The delay 308 receives as input the gain-reduced audio signal x'[m,n] 307 and produces as output the delayed, gain-reduced audio signal x" [m,n] 314. The delay 308 also makes available its entire buffer of delayed audio signals as signal 309. The peak-sample finder 310 receives as input the delay-buffer signal 309 and the threshold signal 201 and produces as output control signal P' [n] 311. The fast gain calculator 312 receives as input the control signal P' [n] 311 and produces as output the fast gain reduction value $G_{FAST}$[n] 313. The multiplier 315 receives as input the fast gain reduction value $G_{FAST}$[n] 313 and the delayed, gain-reduced audio signal x'[m,n] 314 and produces as output the final gain reduced samples x"[m,n] 103.

At each iteration of the operations of the slow and fast gain reducers 202 and 204, one sample from each of the input channels is processed and both a single slow gain reduction value and a single fast gain reduction value are calculated and applied to all channels. Since all the channels receive the same slow and fast gain reduction, the apparent direction of virtual images and the direction of matrix encoded audio signals are maintained.

Slow Gain Reduction

Detecting Excursions (Detecting Audio Exceeding the Limiter Threshold)

The excursion detector 302 sets the control signal Q[n] 303 to zero (0) when the maximum absolute sample across all M channels of the input audio signal 101 is not greater than the limiter threshold T. When the maximum absolute sample across all M channels exceeds the limiter threshold T, the excursion detector 302 sets the control signal Q[n] 303 to a signal proportionate to the extent the input signal exceeds the limiter threshold T.

Thus the slow gain reducer 202 reduces the input audio signal 101 to output the intermediate audio signal 307 only when the input signal 101 exceeds the limiter threshold T.

Thus, in producing the intermediate audio signal 307, the slow gain reducer 202 responds when the input audio signal 101 exceeds the limiter threshold T—but may continue to reduce gain after the audio signal 303 drops below the threshold T.

In one embodiment, if the maximum absolute sample across all M channels of the input signal 101 is greater than the limiter threshold T, the control signal Q[n] is set to the ratio of the maximum absolute sample to the threshold T, less one. Equation (1) details this embodiment.

$$Q[n] = \begin{cases} \dfrac{max_m\{|x[m,n]|\}}{T} - 1 & max_m\{|x[m,n]|\} > T \\ 0 & max_m\{|x[m,n]|\} \leq T \end{cases} \quad (1)$$

Figure 4:
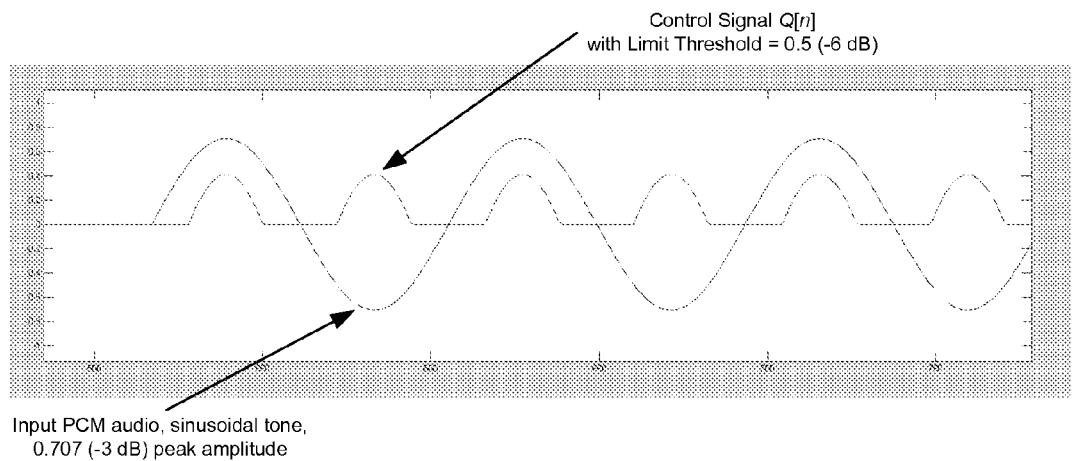
FIG. 4 illustrates several hundred samples of an input signal and the corresponding control signal that the excursion detector outputs according to one embodiment of the invention.

FIG. 4 illustrates several hundred samples of an input signal and the corresponding control signal Q[n] 303 according to one embodiment of the invention. The input signal is a digital sine wave at 500 Hz with peak amplitude of −3 dB, and the limiter threshold T is 0.5 or −6.02 dB. As shown in FIG. 4, the control signal Q[n] 303 sample value is computed for each input PCM sample.

(To reduce computational complexity, instead of the division operation shown, a multiplication by 1/T can implement the computation of Q[n].)

Calculating the Slow Gain

Figure 5:
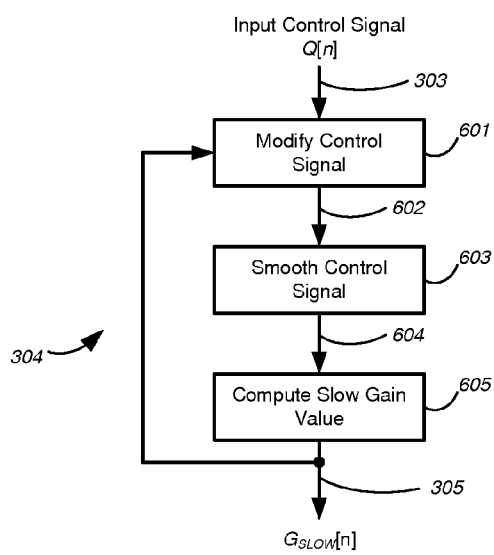
FIG. 5 is an overview of the process of the slow gain calculator according to one embodiment of the invention.

FIG. 5 is an overview of the process of the slow gain calculator 304 according to one embodiment of the invention. Receiving as input the control signal Q[n] 303 and the previous slow gain value $G_{SLOW}$[n−1] 305, the slow gain calculator 304 modifies the control signal Q[n] 303 (step 601), smoothes the modified control signal 602 (step 603) and from the modified, smoothed control signal 604 computes the current slow gain value $G_{SLOW}$[n] 305 (step 605).

In one embodiment, the smoothing step 603 incorporates signal-dependent attack and release characteristics.

Modifying the Control Signal

The slow gain calculator 304 modifies (warps) the control signal Q[n] 303 by the previous slow gain value $G_{SLOW}$[n−1] to create the modified control signal Q'[n] 602. The previous slow gain value $G_{SLOW}$[n−1] 305 is initially set to unity or a value of 1.0.

This modification amplifies (increases) the influence of the control signal Q[n] 303 on increasing the amount of gain reduction when the gain reduction is already non-unity—that is, if gain reduction is already being applied. Beneficially, infrequent occurrences of signal clipping (that is to say, excursions that will be clipped) have less of an effect in generating slow gain reduction but frequent occurrences in rapid succession result in significantly more gain reduction. Thus, for infrequent clip occurrences, this stage works little and avoids the possibility of audible pumping.

Figure 6:
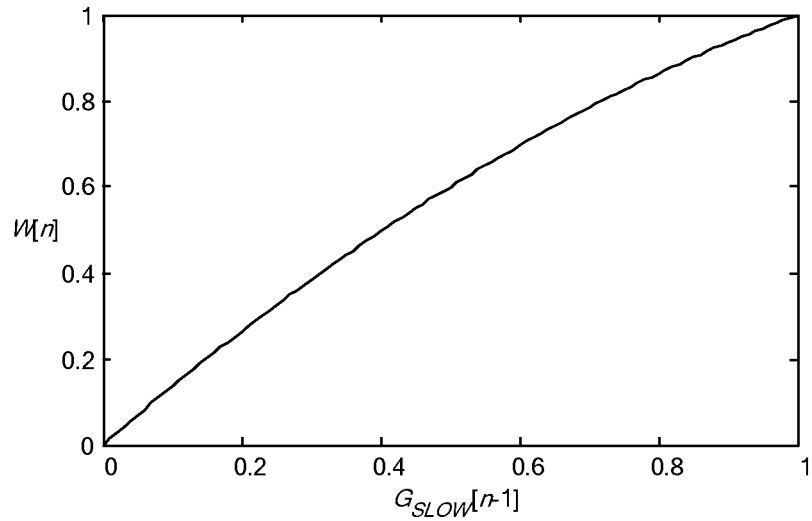
FIG. 6 plots the warping function of the slow gain calculator 304 according to one embodiment of the invention.

Equations 2a and 2b show warping according to one embodiment of the invention, and FIG. 6 plots that warping function. The warping of Equations 2a and 2b and FIG. 6 was determined by extensive experimentation and testing. Its effect is most prominent when the previous slow gain value is approximately −6 dB (as can be seen in FIG. 6).

$$Q'[n]=Q[n]*W[n] \quad (2a)$$

$$W[n]=1.4*G_{SLOW}[n-1]-0.4*(G_{SLOW}[n-1])^2 \quad (2b)$$

Smoothing the Control Signal

According to one embodiment of the invention, a filter with signal-dependent attack and release times smoothes the modified control signal Q'[n] 602. These signal-dependent techniques minimize audible artifacts from the application of the gain reduction, especially where large amounts of gain reduction are required.

In one embodiment, a digital emulation of an analog RC circuit, well known in compressors/limiters, smoothes the modified control signal Q'[n] 602. Here, varying the resistor values effects signal-dependent attack and release behavior.

Figure 8:
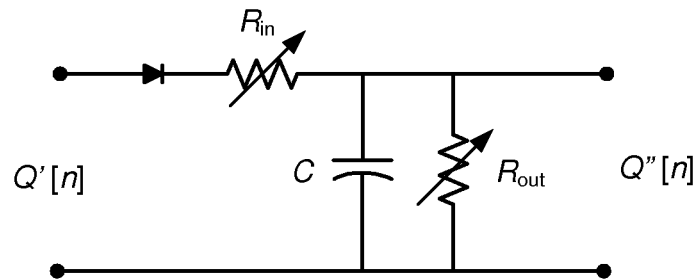
FIG. 8 models an RC circuit of the slow gain calculator according to one embodiment of the invention.

FIG. 8 models such a circuit according to one embodiment of the invention. For simplicity of the model, the voltage drop across the diode is assumed to be zero and the output resistor $R_{out}$ is ignored during the charging of the capacitor C. The preferred value of C is 1 μF.

Figure 7:
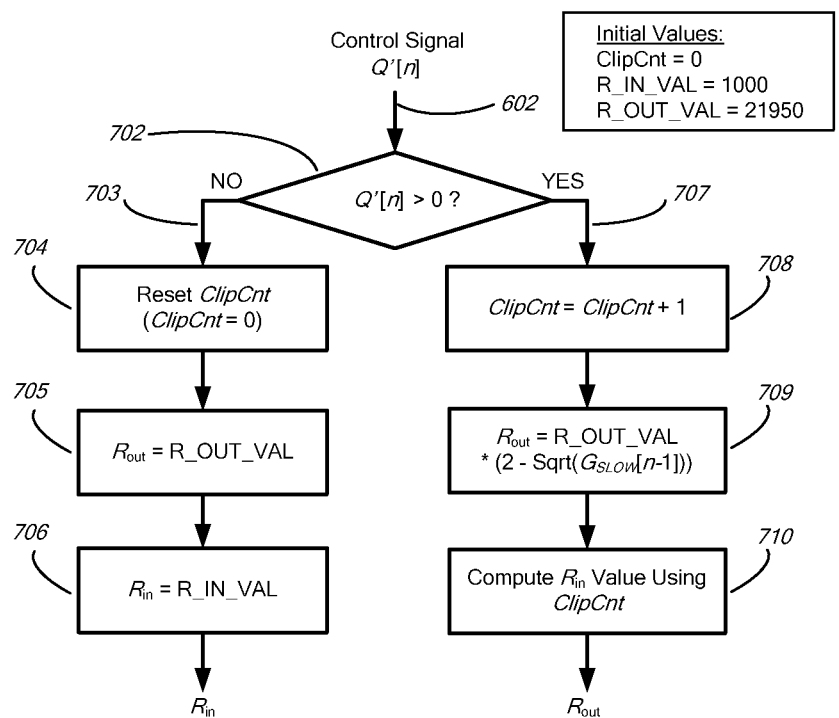
FIG. 7 charts the updating of the resistor values of an RC model of the slow gain circuit according to one embodiment of the invention.

FIG. 7 charts the updating of the resistor values according to one embodiment of the invention. If the modified control signal Q'[n] 602 is greater than zero—that is, the current input sample magnitude exceeds the limiter threshold, the sample clip count is incremented (step 708), thereby increasing the measure of the length of time in clipping and the input resistor $R_{in}$ is calculated as a function of the length of time in clipping (step 709). Also the output resistor $R_{out}$ is calculated as a function of the previous gain reduction value $G_{SLOW}$[n−1] (step 709).

If the modified control signal Q'[n] 602 is not greater than zero (step 702)—that is, the current sample magnitude does not exceed the limiter threshold—the resistors are set to default values (steps 705 and 706) and the sample clip count is set to zero (step 704), thereby resetting the measure of the length of time in clipping.

By calculating the input resistor $R_{in}$ as a function of the length of time in detecting excursions, the smoother varies its attack time in a frequency-dependent manner. Shorter or higher frequency clip occurrences result in a fast attack time and longer or lower frequency clip occurrences result in a progressively slower attack time. This reduces the potential for dramatic gain fluctuations on lower frequency content and thus minimizes audible thumping. Fast attack behavior of the gain reduction can be tolerated for shorter duration or higher frequency clip occurrences where auditory frequency masking is more prevalent.

Figure 9:
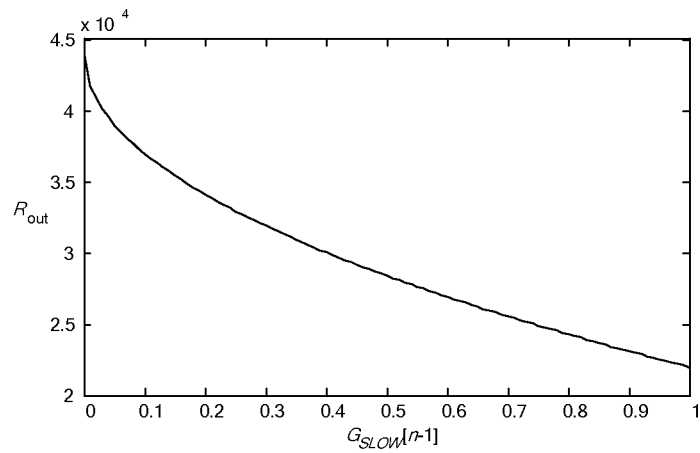
FIG. 9 plots the relationships between the output resistor $R_{out}$ and the previous slow gain reduction value and between the input resistor $R_{in}$ and the number of consecutive input audio samples that exceed the limiter threshold, according to one embodiment of the invention.
Figure 9:
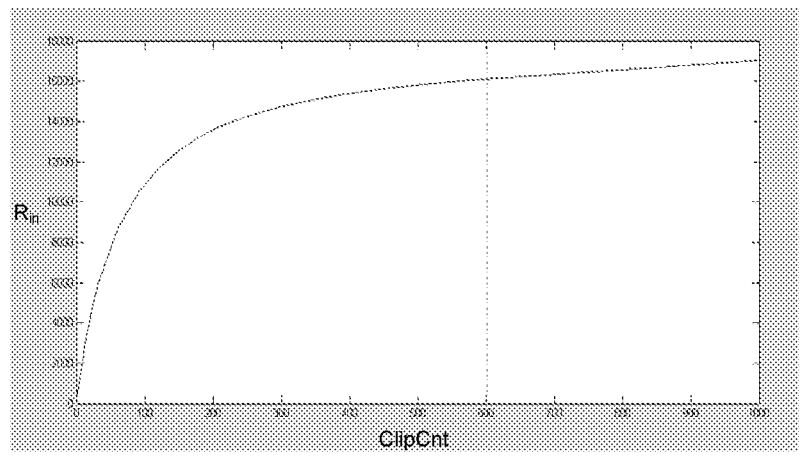

In FIG. 9, the graph "b" plots the relationship between the input resistor $R_{in}$ and the number of consecutive input audio samples that exceed the limiter threshold according to one embodiment of the invention. Resistance is expressed in ohms, and the duration in clipping is expressed in the number of samples in clipping (the clip count) for a sample rate of 44.1 kHz.

The shape of the plot in FIG. 9b derives from experiments and listening tests. For clip lengths of less than ~13 ms (600 samples at 44.1 kHz), $R_{in}$ is non-linear. For clip lengths longer than ~13 ms, $R_{in}$ is linear—as in Equation 5:

$$R_{in}=16100+2.33*(ClipCnt-600) \quad (5)$$

where ClipCnt is the number of samples in clipping at 44.1 kHz.

At low lengths of time in clipping, $R_{in}$ rises quickly with increasing time in clipping. At long lengths of time in clipping, $R_{in}$ rises more slowly. Lower $R_{in}$ values give the slow gain calculator 304 faster attack times and higher $R_{in}$ values slower attack times.

By calculating the output resistor $R_{out}$ as a function of the previous slow gain reduction value, the slow gain calculator 304 can alter its release behavior in proportion to the amount of reduction in use. When little gain reduction is in use, a faster release time allows the gain reduction to more quickly return to unity. When a significant amount of gain reduction is in use, the release time increases to minimize audible pumping artifacts. This also means that when large and sustained amounts of gain reduction are required, the slower first stage accounts for more of the gain reduction than the faster second stage. This helps minimize audible spectral splatter that the second stage can generate when applying large amounts of gain reduction.

(Multiplying audio by a variable gain factor can be considered an amplitude modulation. As such, the operation introduces additional spectral components which may be audible, depending on the spectrum of the audio, the spectrum of the variable gain factor and the degree of gain change. Herein, these components are called "spectral splatter.")

In FIG. 9, the graph "a" plots the relationship between the output resistor $R_{out}$ and the previous slow gain reduction value $G_{SLOW}$[n−1] according to one embodiment of the invention. The more the amount of gain reduction previously used, the lower the value of $R_{out}$ and thus the faster the release behavior of the smoothing circuit.

Equation 3 calculates the output resistor value:

$$R_{out}=21950*(2-\sqrt{G_{SLOW}[n-1]}) \quad (3)$$

For many computers and digital signal processors (DSPs), computation of a square root is computationally expensive. However, computationally cheaper methods can approximate the square-root function. The preferred method is the "Newton Iteration" iterative square root estimate equation, shown in Equation 4.

$$SqrEstimate[k] = 0.5 * \frac{SqrtEstimate[k-1] + G_{SLOW}[n-1]}{SqrtEstimate[k-1]} \quad (4)$$

In this Equation, the square-root estimate for iteration k is a function of the previous k−1 estimate and the value for which the square root is being computed—in this case $G_{SLOW}[n-1]$.

Normally, multiple iterations are required to obtain a single, relatively accurate estimate. However, since the slow gain reduction value changes relatively slowly over time, it is sufficiently accurate to perform one iteration and use the square root estimate from the previous sample or slow gain reduction calculation. This does, however, require a single division operation which can be either tolerated computationally or replaced with a lookup table of discrete values—possibly at the expense of accuracy.

The smoothing of the control signal by the modeled RC circuit operates as follows. If the control signal Q'[n] 602 is greater than the capacitor voltage from the previous calculation Q''[n−1] 602, then the capacitor is charged through $R_{in}$ and discharged through $R_{out}$ as follows.

$$Q''[n] = Q''[n-1] + \frac{Q'[n] - Q''[n-1]}{R_{in} * C * fs} \quad (6a)$$

$$Q''[n] = Q''[n] - \frac{Q''[n]}{R_{out} * C * fs} \quad (6b)$$

Otherwise the capacitor is simply discharged through $R_{out}$ as follows:

$$Q''[n] = Q''[n-1] - \frac{Q''[n-1]}{R_{out} * C * fs} \quad (7)$$

(The parameter fs is the sampling rate in Hz.) The smoothed control signal Q''[n] 604 is then used to calculate the slow gain reduction value.

Since division operations can be computationally expensive on many computers and DSPs, the useful range of values of $1/R_{in}$ and $1/R_{out}$ can be stored as discrete values in lookup tables. This can be tolerated without audible variation of the control signal Q''[n] 604 from the ideal in Equations 6 and 7.

Computing the Slow Gain Value

Following from Equation 1, the slow gain reduction value would typically be a function of the reciprocal of the adjusted and smoothed control signal Q''[n] 604. Equation 8 shows this:

$$G_{SLOW}[n] = \frac{1}{1 + Q''[n]} \quad (8)$$

However, due to the smoothing characteristics and after much experimentation, the preferred function has a subtractive form, as Equation 9 shows.

$$G_{SLOW}[n] = 1 - Q''[n] * s \quad (9)$$

(The constant s has a value of 1.65.)

While this function is preferred, it can theoretically result in negative gain for large values of the control signal Q''[n] 604. For practical purposes, where the typical amount of required gain reduction is less than 20 dB, the smoothing ensures that the slow gain reduction is always greater than zero.

Finally, the multiplier 306 multiples the slow gain reduction value $G_{SLOW}[n]$ 305 with the PCM samples from each of the input channels m to create the gain-reduced samples x'[m,n] 307.

$$x'[m,n] = x[m,n] * G_{SLOW}[n], \text{ for all } m \quad (10)$$

Fast Gain Reduction
Delaying

The slow gain reduced samples x'[m,n] 307 pass through a delay 308. This provides the fast gain reducer 204 with look-ahead so that the fast gain reducer 204 can know when an excursion beyond the limiter threshold will occur and can calculate a fast gain reduction that ensures that the output audio signal does not exceed the threshold. The look ahead allows a finite amount of time for the fast gain reduction to slew to meet the excursion beyond the limiter threshold and therefore reduces the amount of audible spectral splatter resulting from the gain trajectory, when compared to a limiter with no look ahead.

One embodiment of the delay 308 is a delay line and, more specifically, a delay line 308 with a look ahead of approximately 1.5 ms or N=66 samples at a sampling rate of 44.1 kHz. The delay line 308 can be a first-in-first-out (FIFO) buffer, and the output is the audio sample signal x''[m,n] 314. Where more than one channel is present, each channel m is delayed by the same number of samples.

Regarding the length of the delay 308, longer gain changes are desirable. In one embodiment, however, an overriding goal is keeping latency as low as possible. Experiments indicate that gain changes faster than 1 ms can be quite audible and annoying. A look ahead of about 1.5 ms is a good compromise.

A delay line implementation of the delay 308 is assumed in the following description.

Finding Peak Samples

Figure 10:
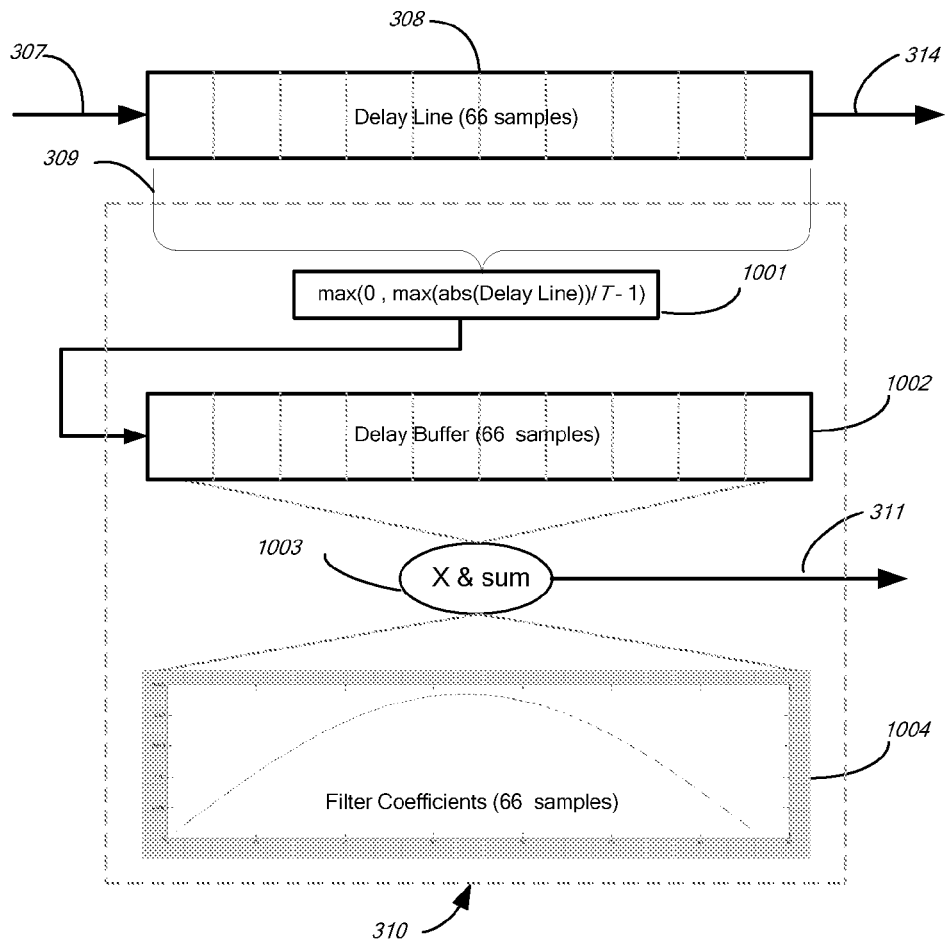
FIG. 10 details the peak-sample finder according to one embodiment of the invention.

FIG. 10 details the peak-sample finder 310 according to one embodiment of the invention. In this embodiment, the peak-sample finder includes a memory 1004 for storing filter coefficients, a CPU 1003 or other computation means 1003, a delay buffer 1002 and comparator and difference engine 1001. (Of course, the CPU 1003 or other computation means 1003 may be the same as the comparator and difference engine 1001.)

The comparator and difference engine 1001 receives as input the delay-buffer signal 309 of the delay 308 and outputs an intermediate control signal. The delay buffer 1002 receives as input that intermediate control signal and produces as output the contents of its buffer. The computing means 1003 receives as input the contents of the delay buffer 1002 and the contents of the memory 1004 and outputs the control signal 311.

The peak-sample finder 310 finds and holds the peak value across a defined length of time. It takes the output 309 of the delay 308 and generates a control signal P[n] 311 that is a function of the maximum sample value across the contents of the delay 308 that has exceeded the limiter threshold T (here, across the length of the delay line 308, effectively the previous ~1.5 ms).

Figure 16:
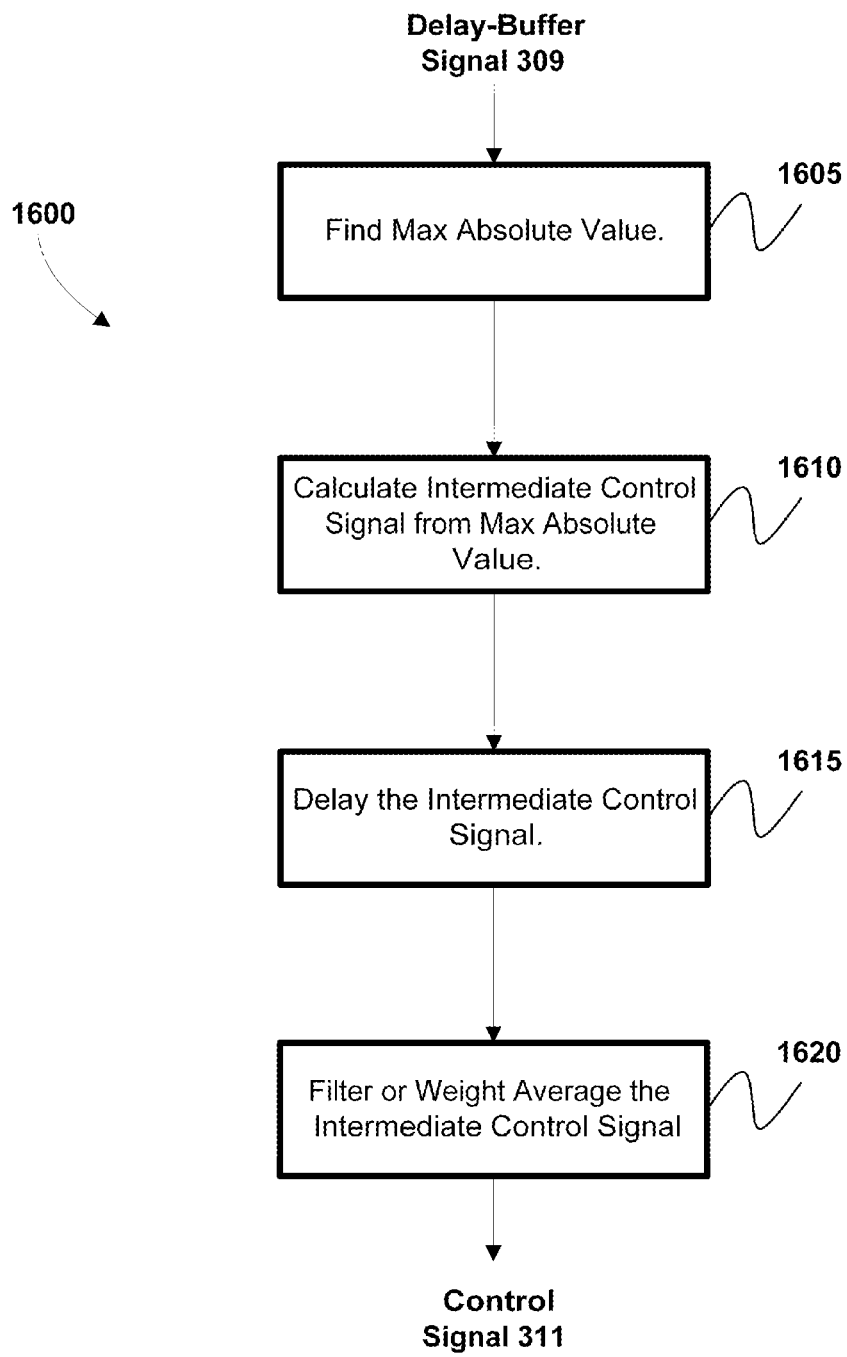
FIG. 16 is an overview of the process of the slow peak-sample finder according to one embodiment of the invention.

FIG. 16 is an overview of the process 1600 of the peak-sample finder 310 according to one embodiment of the invention. With each input sample, the peak-sample finder 310 finds the maximum absolute value across the length of the delay line 308 and across all m channels (step 1605). It 310 then divides the maximum absolute value by the limiter threshold T and subtracts one to create the intermediate control signal P[n] (step 1610). (Multiplication by 1/T can efficiently implement the division by T, as in Equation (1).):

$$P[n] = \begin{cases} \dfrac{max_{m,n}\{|x'[m,n]|\}}{T} - 1 & max_{m,n}\{|x'[m,n]|\} > T \\ 0 & max_{m,n}\{|x'[m,n]|\} \le T \end{cases} \quad (11)$$

This intermediate control signal P[n] passes through a FIFO delay line or delay buffer 1002 which has the same length as delay line 308 (step 1615).

The peak-sample finder 310 then calculates the output control signal P'[n] 311 from the low pass-filtered or weighted averaged intermediate control signal P[n] (step 1620). The delay line 1002 provides for an (N−1)th order filter or average.

The peak-sample finder 310 calculates the preferred filter coefficients or weighting values H[i] 1004 from the square root of a Hanning Window of length N (the same length as the delay buffer 1002). Empirically, these produce minimal audible artifacts.

$$P'[n] = \sum_{i=0}^{N-1} DelayBuffer[i] * H[i] \quad (12a)$$

where $$H[i] = \dfrac{W[i]}{\sum_{j=0}^{N-1} W[j]}, \quad \text{for } 0 <= i < N-1 \quad (12b)$$

and where $$W[j] = \sqrt{Hanning[j]}, \quad \text{for } 0 <= j < N-1 \quad (12c)$$

The normalization step in Equation 12b ensures that the filter coefficients H[i] 1004 sum to unity.

Calculating Fast Gain

In one embodiment, the fast gain reduction value is the inverse of one plus the smoothed peak control signal P'[n] 311. This is essentially the reverse of the peak-sample finding operation in Equation 11. See Equation 13:

$$G_{FAST}[n] = \dfrac{1}{1+P'[n]} \quad (13)$$

Because the lengths of the two delays lines 308 and 1002 are the same, the fast gain reduction value in Equation 13 reaches the value required to reduce the absolute peak to the level of the limiter threshold T at the same time as the peak sample emerges from the delay line 308. An even delay length N results in an integer sample group delay from the audio signal 307 through to the control signal P'[n] 311 and corresponding fast gain reduction value $G_{FAST}[n]$.

Since, as previously mentioned, division operations on many computers and DSPs can be computationally expensive, a non-division-based method for calculating the fast gain reduction value in Equation 13 would be beneficial. The use of a lookup table containing discrete values, however, requires significant memory to retain accuracy and avoid spurious spectral splatter that would arise from a coarse-valued look-up table.

An alternative is to approximate the fast gain reduction value using the "Newton-Rhapson" iterative estimation equation. The "Newton-Rhapson" estimation iteratively solves equations of the form:

$$f(x)=0 \quad (14)$$

The well known "Newton-Rhapson" iterative approximation uses an initial estimate value of x or $x_0$ and calculates an updated value of x or $x_1$. The initial and updated values are computed using the "Newton-Rhapson" approximation equation:

$$x_1 = x_0 - \dfrac{f(x_0)}{f'(x_0)} \quad (17)$$

where f(x) represents the function shown in Equations 14, 15 and 16 and f'(x) is the derivative of the function.

For the fast gain reduction value Equation 13 for which we are attempting to solve, the value of $G_{FAST}[n]$ (x) and therefore Equation 13 takes the generic form $$x = \dfrac{1}{1+P'[n]} = \dfrac{1}{a} \quad (15)$$

Then the "Newton-Rhapson" approximation solves Equation 15 in the form of Equation 14:

$$f(x)=x*a-1 \quad (16)$$

where a=(1+P'[n]). For the equation we are trying to solve in Equation 16 the "Newton-Rhapson" approximation of Equation 17 takes the form $$x_1 = x_0 - \dfrac{(x_0 * a) - 1}{a} \quad (18)$$

This form, however, still requires a division by a and does not efficiently implement Equation 15. But for the fast gain reduction computation we can leverage the fact that 1/a approximates $x_0$. Given this approximation, Equation 18 takes the form $$x_1 = x_0 - ((x_0*a) - 1)*x_0 \quad (19)$$

giving the "Newton-Rhapson" method:

$$x_1 = x_0 * (1 - ((x_0*a) - 1)) \quad (20)$$

This approximation fairly quickly converges to the value of x with the number of decimal places of accuracy doubling with each computational iteration.

To keep the computational cost of the approximation low, useful convergence in as low as a single iteration is desirable. Equation 20, however, exhibits undesirable fluctuations from sample to sample for a single iteration. The convergence of the iteration can be slowed to provide a solution that introduces fewer artifacts. If the speed-of-convergence term S is applied to Equation 20, the equation takes the form:

$$x_1 = x_0 * (1 - S*((x_0*a) - 1)) \quad (21)$$

where S=1 indicates the full "Newton-Rhapson," and S=0.001 translates to the method deliberately converging very slowly. In practice, avoiding undesirable behavior of the convergence of Equation 21 requires proper selection of the value of S. For example, preferably, S is a value such that $$-\frac{1}{2} < S * ((x_0 * a) - 1) < \frac{1}{2} \quad (22)$$

because larger values of this expression may cause an "over-reaction" in convergence.

Applying the control parameters used in the calculation of $G_{FAST}[n]$ where $x_1 = G_{FAST}[n]$, $x_0 = G_{FAST}[n-1]$ and $a = (1+P'[n])$, Equation 21 takes the form:

$$G_{FAST}[n] = G_{FAST}[n-1] * (1 - 0.3 * ((1+P'[n]) * G_{FAST}[n-1] - 1)) \quad (23)$$

Figure 11:
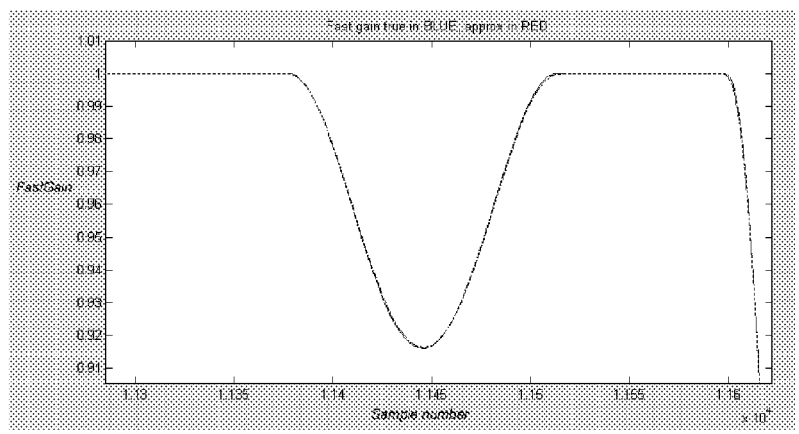
FIG. 11 shows approximate "Newton-Rhapson" estimated fast gain reduction values for several hundred samples overlaid with the true values.

In this equation, the fast gain reduction value $G_{FAST}[n]$ is a function of the previous value from the previous time sample n−1 and the input value to the equation—in this case P'[n]. As mentioned previously, an accurate estimate typically requires multiple iterations. In this method, however, a single iteration slowly stewing the fast gain reduction value $G_{FAST}[n]$ toward the desired 1/(1+x) value results in less audible artifacts than a more accurate estimate or even the exact calculation. Listening experiments have found that a value of S=0.3 provides very good results with minimal audible artifacts in the audio. FIG. 11 shows an example of the approximated "Newton-Rhapson" FastGain values for several hundred samples overlaid with the true values computed using Equation 13.

Finally, multiplication of the product of the fast gain reduction value $G_{FAST}[n]$ 313 and the previously gain reduced samples x'[m,n] output from the delay line 308 produces the final gain reduced samples x"[m,n] 103 (step 1625).

$$x''[m,n] = x'[m,n] * G_{FAST}[n], \text{ for all } m \quad (24)$$

Figure 12:
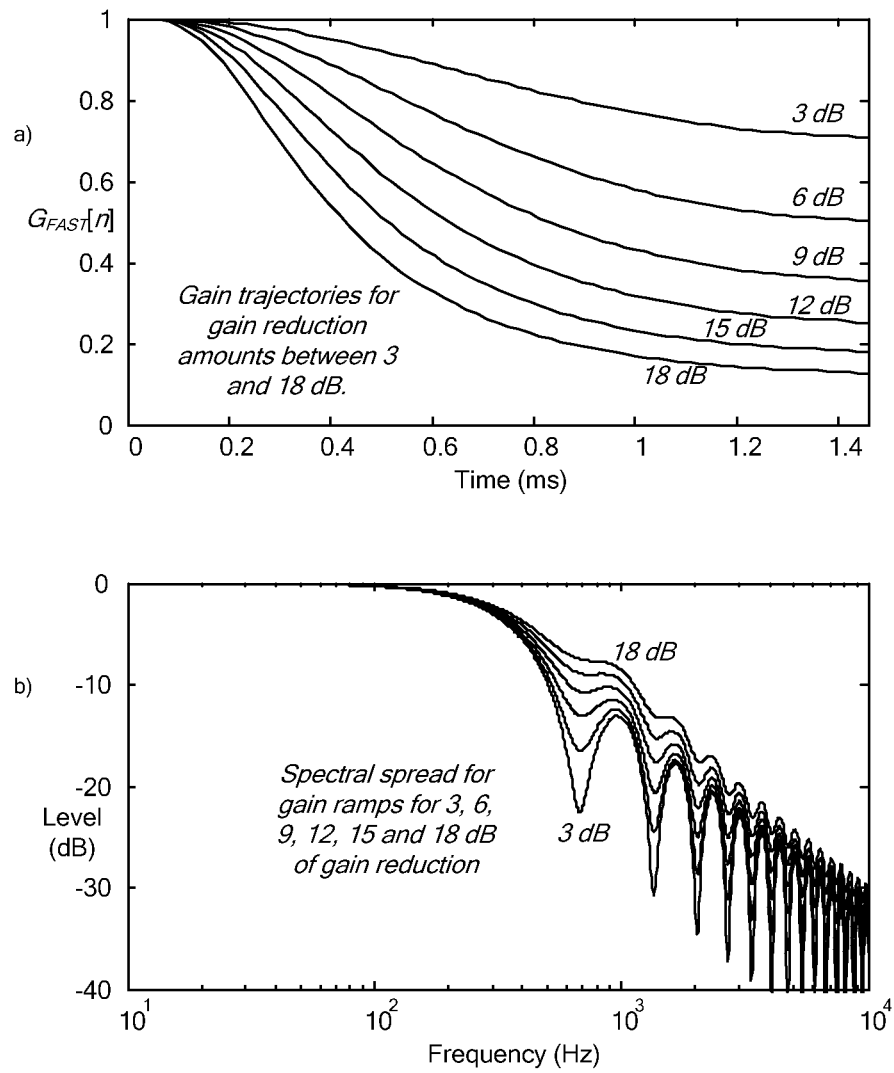
FIG. 12 plots fast gain reduction for signals that clip by between 3 and 18 dB according to one embodiment of the invention, as well as larger amounts of gain reduction against correspondingly higher amounts of spectral dispersion.
Figure 15:
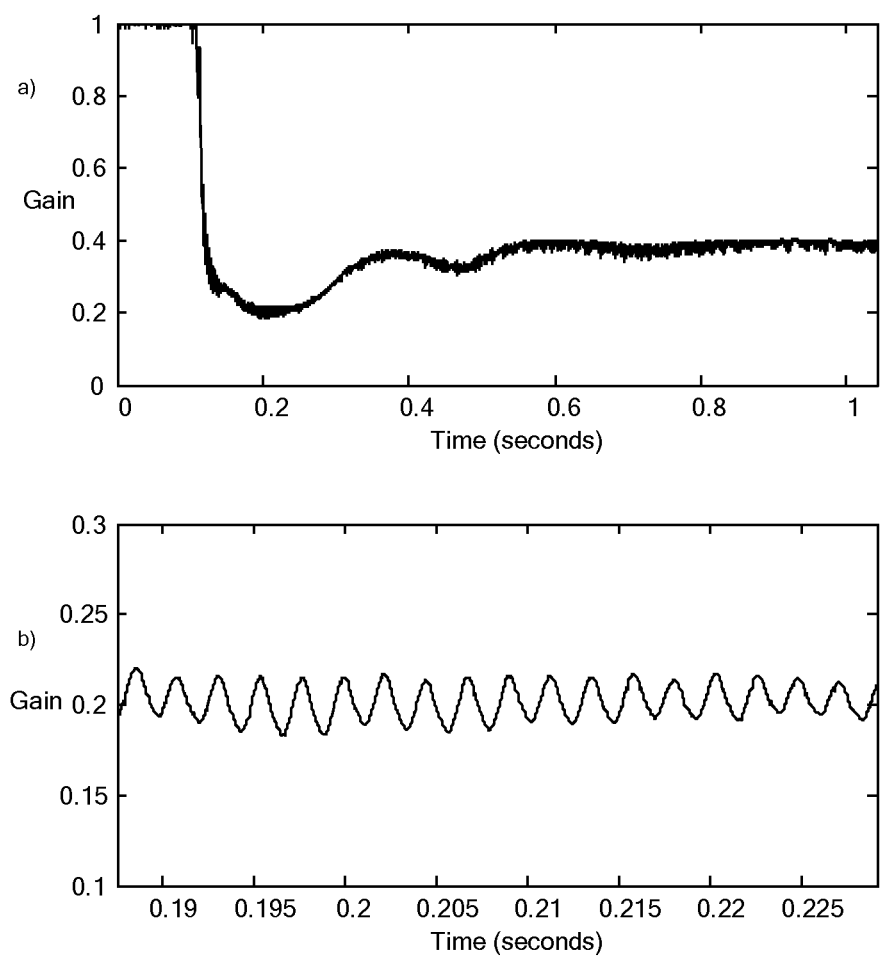
FIG. 15 shows how the two stages of the limiter work under heavy and sustained clip reduction conditions according to embodiments of the invention.

In FIG. 12, the graph "a" plots fast gain reduction for signals that clip by between 3 and 18 dB according to one embodiment of the invention. The clip occurs at approximately 1.5 ms, and the plots show how the look-ahead anticipates the clip occurrence. Larger amounts of gain reduction result in higher rates of change of gain and correspondingly higher amounts of spectral dispersion, shown in the graph "b" of FIG. 12. However, since the first, slow gain reduction stage precedes this gain reduction stage, the fast stage does not have to provide as much gain reduction as if used alone, and thus audible spectral dispersion is minimized. An example of this is shown in FIG. 15 and is discussed further below.

In FIG. 12, the graph "b" shows ripple in the spectral dispersion due to the use of an FIR filter in the peak smoothing. An IIR filter could remove the ripple, but the resulting frequency varying group delay in the smoother would not guarantee that the audio signal is reduced to exactly the level of the limiter threshold. The fast gain reduction value could drop too early or too late to meet the samples requiring gain reduction and would not reach exactly the required gain value.

Performance

Figure 13:
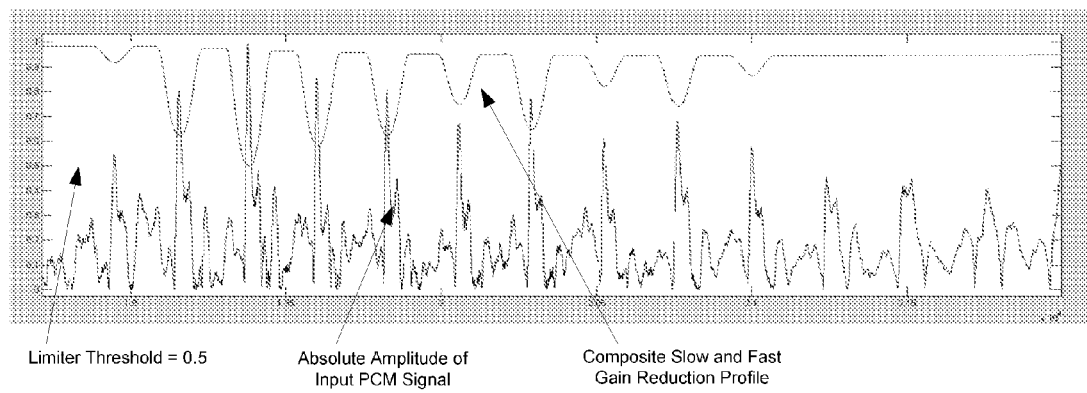
FIG. 13 shows the resulting peak limiting gain reduction signal computed by an embodiment of the present invention for one-half second of typical 44.1 kHz digital audio content.

FIG. 13 shows the resulting peak limiting gain reduction signal computed by an embodiment of the present invention for one-half second of typical 44.1 kHz digital audio content. In the example shown, the limiter threshold T was 0.5 or −6 dB. The bottom half of the diagram shows the absolute amplitude of the input PCM signal (speech), and the top half of the diagram shows the composite slow and fast gain reduction signal. In FIG. 13, the slow gain component provides a minimal, slowly varying gain reduction signal (over the whole width of the figure) while the fast gain component provides more significant gain reduction for short-term signal components exceeding the limiter threshold.

Figure 14:
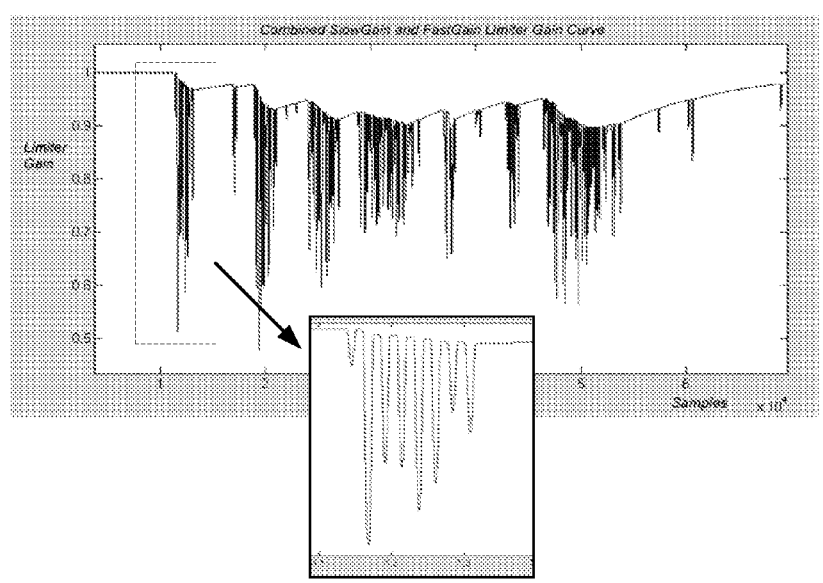
FIG. 14 shows another peak limiting gain reduction signal computed by an embodiment of the present invention for a one and a half seconds of typical 44.1 kHz digital audio content.

FIG. 14 shows another peak-limiting gain reduction signal computed by an embodiment of the present invention for a one and a half seconds of typical 44.1 kHz digital audio content. In the example shown, the limiter threshold T was 0.25 or −12 dB. In FIG. 14, the slow-gain component provides a modest amount of slowly varying gain reduction signal (over the whole width of the figure) while the fast-gain component provides occasional short-term gain reduction for short-term signal components exceeding the limiter threshold. Due to image scaling, the short-term gain reduction components appear as vertical lines, so FIG. 14 also magnifies a portion of the gain-reduction signal, showing in more detail the short-term gain-reduction component. The short-term gain-reduction components in FIG. 14 have similar shape and duration as those shown in FIG. 13.

FIG. 15 shows how the two stages work under heavy and sustained clip reduction conditions according to an embodiment of the invention. The plot shows the combined gain reduction trajectory for a sudden-onset pitch-pipe signal requiring ~10 dB of sustained gain reduction. In FIG. 15, the graph "a" gives a broad view of the gain reduction over approximately a 1 second interval. In FIG. 15, the graph "b" shows the very fine detail around 0.2 seconds. In this example, the first, slowly varying gain-reduction stage provides most of the gain reduction at around 0.2 or −14 dB, and the second, fast-acting gain-reduction stage accounts for the ripple of approximately ±1 dB.

The invention claimed is:

1. A method for limiting peaks in an audio signal, wherein the method comprises:
   receiving an input audio signal;
   detecting excursions of the input audio signal that exceed a threshold;
   calculating a first gain in response to the detected excursions, wherein changes in the first gain are limited to a first rate of change;
   applying the first gain to the input audio signal to generate an intermediate audio signal;
   applying a delay line to the intermediate audio signal to generate a delayed intermediate audio signal;
   identifying one or more peak values of the intermediate audio signal within the delay line that exceed the threshold;
   calculating a second gain in response to the identified one or more peak values, wherein changes in the second gain are limited to a second rate of change that is higher than the first rate of change; and
   applying the second gain to the delayed intermediate audio signal to generate an output audio signal whose peak values do not exceed the threshold.

2. The method of claim 1 that calculates the first gain in response to numbers and amounts of the detected excursions.

3. The method of claim 1 that comprises calculating the second gain to change at a rate just sufficient to reduce the output audio signal amplitude to be at or under the threshold when the peak values of the intermediate audio signal exit the delay line.

4. The method of claim 1 that comprises:
   applying the delay line to the intermediate audio signal by receiving samples that represent the intermediate audio signal at an input of a first buffer having a length equal to L and passing the samples through the first buffer to an output of the first buffer, wherein the first buffer is a first-in-first-out buffer that stores a number of samples equal to L; and identifying the one or more peak values and calculating the second gain for each sample of the intermediate audio signal that is received at the input of the first buffer by:
  deriving an intermediate control value from the sample stored in the first buffer having the largest magnitude;
  passing the intermediate control value through a second buffer having a length equal to L, wherein the second buffer is a first-in-first-out buffer having a length equal to L and stores a number of intermediate control values equal to L;
  multiplying the intermediate control values stored in the second buffer by filter coefficients and summing the multiplication products to obtain a gain control value; and
  calculating the second gain in response to the gain control value.

5. The method of claim 4, wherein the filter coefficients have values from the square root of a Hanning window function of length L.

6. The method of claim 4 that comprises calculating the second gain by Newton-Raphson numerical approximation of an amount that varies inversely with the gain control value.

7. An apparatus for audio signal peak limiting that comprises:
  means for receiving an input audio signal;
  means for detecting excursions of the input audio signal that exceed a threshold;
  means for calculating a first gain in response to the detected excursions, wherein changes in the first gain are limited to a first rate of change;
  means for applying the first gain to the input audio signal to generate an intermediate audio signal;
  means for applying a delay line to the intermediate audio signal to generate a delayed intermediate audio signal;
  means for identifying one or more peak values of the intermediate audio signal within the delay line that exceed the threshold;
  means for calculating a second gain in response to the identified one or more peak values, wherein changes in the second gain are limited to a second rate of change that is higher than the first rate of change; and
  means for applying the second gain to the delayed intermediate audio signal to generate an output audio signal whose peak values do not exceed the threshold.

8. The apparatus of claim 7 that calculates the first gain in response to numbers and amounts of the detected excursions.

9. The apparatus of claim 7 that comprises means for calculating the second gain to change at a rate just sufficient to reduce the output audio signal amplitude to be at or under the threshold when the peak values of the intermediate audio signal exit the delay line.

10. The apparatus of claim 7 that comprises:
  means for applying the delay line to the intermediate audio signal by receiving samples that represent the intermediate audio signal at an input of a first buffer having a length equal to L and passing the samples through the first buffer to an output of the first buffer, wherein the first buffer is a first-in-first-out buffer that stores a number of samples equal to L; and
  means for identifying the one or more peak values and calculating the second gain for each sample of the intermediate audio signal that is received at the input of the first buffer by:
    deriving an intermediate control value from the sample stored in the first buffer having the largest magnitude;
    passing the intermediate control value through a second buffer having a length equal to L, wherein the second buffer is a first-in-first-out buffer having a length equal to L and stores a number of intermediate control values equal to L;
    multiplying the intermediate control values stored in the second buffer by filter coefficients and summing the multiplication products to obtain a gain control value; and
    calculating the second gain in response to the gain control value.

11. The apparatus of claim 10, wherein the filter coefficients have values from the square root of a Hanning window function of length L.

12. The apparatus of claim 10 that comprises means for calculating the second gain by Newton-Raphson numerical approximation of an amount that varies inversely with the gain control value.

13. A storage medium recording a program of instructions that is executable by a device to perform a method for audio signal peak limiting, wherein the method comprises:
  receiving an input audio signal;
  detecting excursions of the input audio signal that exceed a threshold;
  calculating a first gain in response to the detected excursions, wherein changes in the first gain are limited to a first rate of change;
  applying the first gain to the input audio signal to generate an intermediate audio signal;
  applying a delay line to the intermediate audio signal to generate a delayed intermediate audio signal;
  identifying one or more peak values of the intermediate audio signal within the delay line that exceed the threshold;
  calculating a second gain in response to the identified one or more peak values, wherein changes in the second gain are limited to a second rate of change that is higher than the first rate of change; and
  applying the second gain to the delayed intermediate audio signal to generate an output audio signal whose peak values do not exceed the threshold.

14. The storage medium of claim 13, wherein the method calculates the first gain in response to numbers and amounts of the detected excursions.

15. The storage medium of claim 13, wherein the method comprises calculating the second gain to change at a rate just sufficient to reduce the output audio signal amplitude to be at or under the threshold when the peak values of the intermediate audio signal exit the delay line.

16. The storage medium of claim 13, wherein the method comprises:
  applying the delay line to the intermediate audio signal by receiving samples that represent the intermediate audio signal at an input of a first buffer having a length equal to L and passing the samples through the first buffer to an output of the first buffer, wherein the first buffer is a first-in-first-out buffer that stores a number of samples equal to L; and
  identifying the one or more peak values and calculating the second gain for each sample of the intermediate audio signal that is received at the input of the first buffer by:
    deriving an intermediate control value from the sample stored in the first buffer having the largest magnitude;
    passing the intermediate control value through a second buffer having a length equal to L, wherein the second buffer is a first-in-first-out buffer having a length equal to L and stores a number of intermediate control values equal to L;

multiplying the intermediate control values stored in the second buffer by filter coefficients and summing the multiplication products to obtain a gain control value; and calculating the second gain in response to the gain control value.

17. The storage medium of claim 16, wherein the filter coefficients have values from the square root of a Hanning window function of length L.

18. The storage medium of claim 16, wherein the method comprises calculating the second gain by Newton-Raphson numerical approximation of an amount that varies inversely with the gain control value.

* * * * *